(12) United States Patent
Chen et al.

(10) Patent No.: US 9,073,158 B2
(45) Date of Patent: Jul. 7, 2015

(54) METHODS FOR FORMING 3DIC PACKAGE

(71) Applicant: Taiwan Semiconductor Manufacturing Company, Ltd., Hsin-Chu (TW)

(72) Inventors: Meng-Tse Chen, Changzhi Township (TW); Chun-Cheng Lin, New Taipei (TW); Kuei-Wei Huang, Hsin-Chu (TW); Yu-Peng Tsai, Taipei (TW); Wei-Hung Lin, Xinfeng Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/096,263

(22) Filed: Dec. 4, 2013

(65) Prior Publication Data

US 2014/0091509 A1 Apr. 3, 2014

Related U.S. Application Data

(62) Division of application No. 13/272,032, filed on Oct. 12, 2011, now Pat. No. 8,609,462.

(51) Int. Cl.
*H01L 23/34* (2006.01)
*B23Q 3/18* (2006.01)
(Continued)

(52) U.S. Cl.
CPC . *B23Q 3/18* (2013.01); *Y10T 29/41* (2015.01); *H01L 21/50* (2013.01); *H01L 24/75* (2013.01); H01L 2224/16225 (2013.01); H01L 2224/32225 (2013.01); H01L 2224/73204 (2013.01); H01L 2224/75983 (2013.01); H01L 2224/75754 (2013.01); H01L 23/49827 (2013.01); *H01L 21/561* (2013.01); H01L 21/563 (2013.01); H01L 23/5389 (2013.01); *H01L 24/13* (2013.01); *H01L 24/16* (2013.01); *H01L 24/32* (2013.01); *H01L 24/81* (2013.01); *H01L 24/83* (2013.01); H01L 2224/75733 (2013.01); H01L 2224/75744 (2013.01); H01L 2224/81191 (2013.01); H01L 2224/81815 (2013.01); H01L 2224/83862 (2013.01); H01L 2224/83868 (2013.01); H01L 2224/83874 (2013.01); H01L 2224/97 (2013.01); H01L 2924/3511 (2013.01); H01L 2224/7598 (2013.01); H01L 2224/83104 (2013.01); H01L 2224/131 (2013.01)

(58) Field of Classification Search
CPC ............. H01L 24/72; H01L 2924/01074; H01L 2924/01079; H01L 2924/01013; H01L 2924/01029
USPC ................................. 257/726, 727
See application file for complete search history.

(56) References Cited

U.S. PATENT DOCUMENTS 6,956,167 B2 * 10/2005 Kurihara et al. ............ 174/521
7,569,471 B2 * 8/2009 Pang et al. .................. 438/612
7,875,496 B2 1/2011 Nakatani et al.

*Primary Examiner* — Quoc Hoang
(74) *Attorney, Agent, or Firm* — Slater & Matsil, L.L.P.

(57) ABSTRACT

A method includes dispensing an underfill between a first package component and a second package component, wherein the first package component is placed on a lower jig, and the second package component is over and bonded to the first package component. A through-opening is in the lower jig and under the first package component. The underfill is cured, wherein during the step of curing the underfill, a force is applied to flatten the first package component. The force is applied by performing an action selected from the group consisting of vacuuming and air blowing through the through-opening.

20 Claims, 15 Drawing Sheets

(51) Int. Cl.
     *H01L 21/50*     (2006.01)
     *H01L 23/00*     (2006.01)
     *H01L 21/56*     (2006.01)
     *H01L 23/498*     (2006.01)
     *H01L 23/538*     (2006.01)

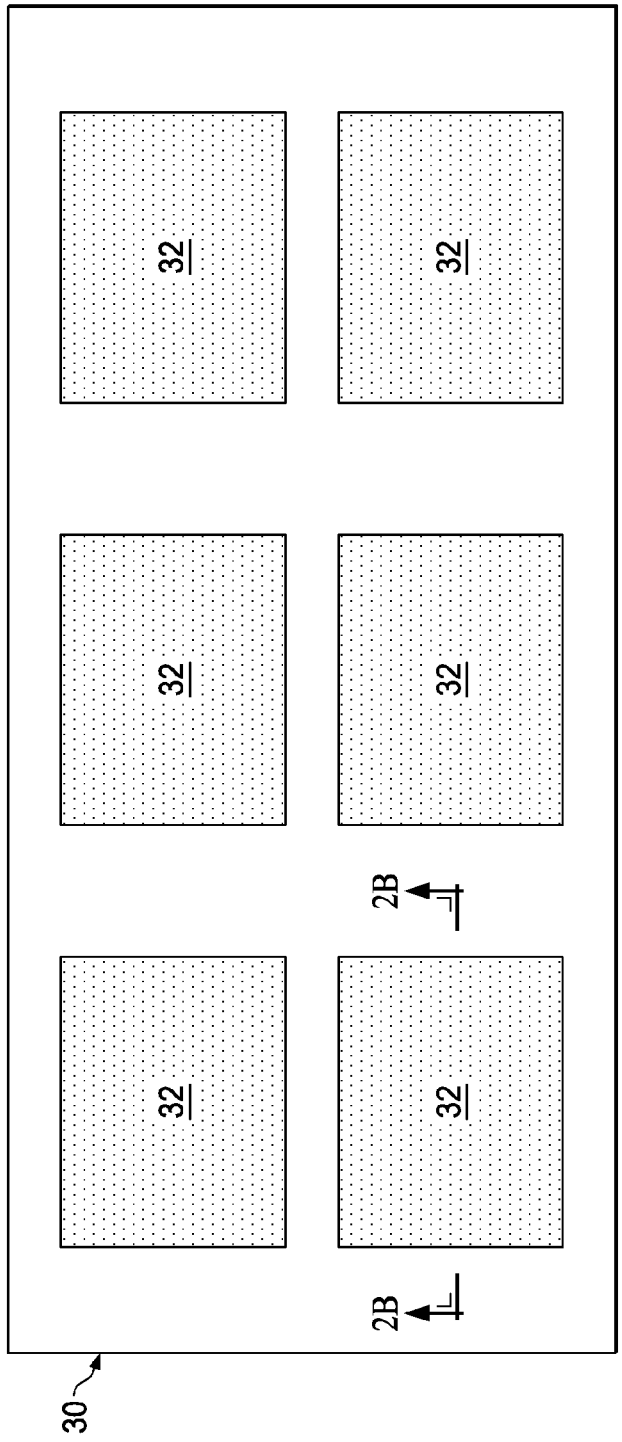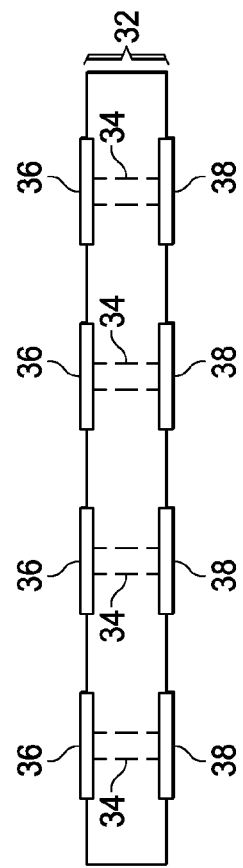
FIG. 2A
FIG. 2B

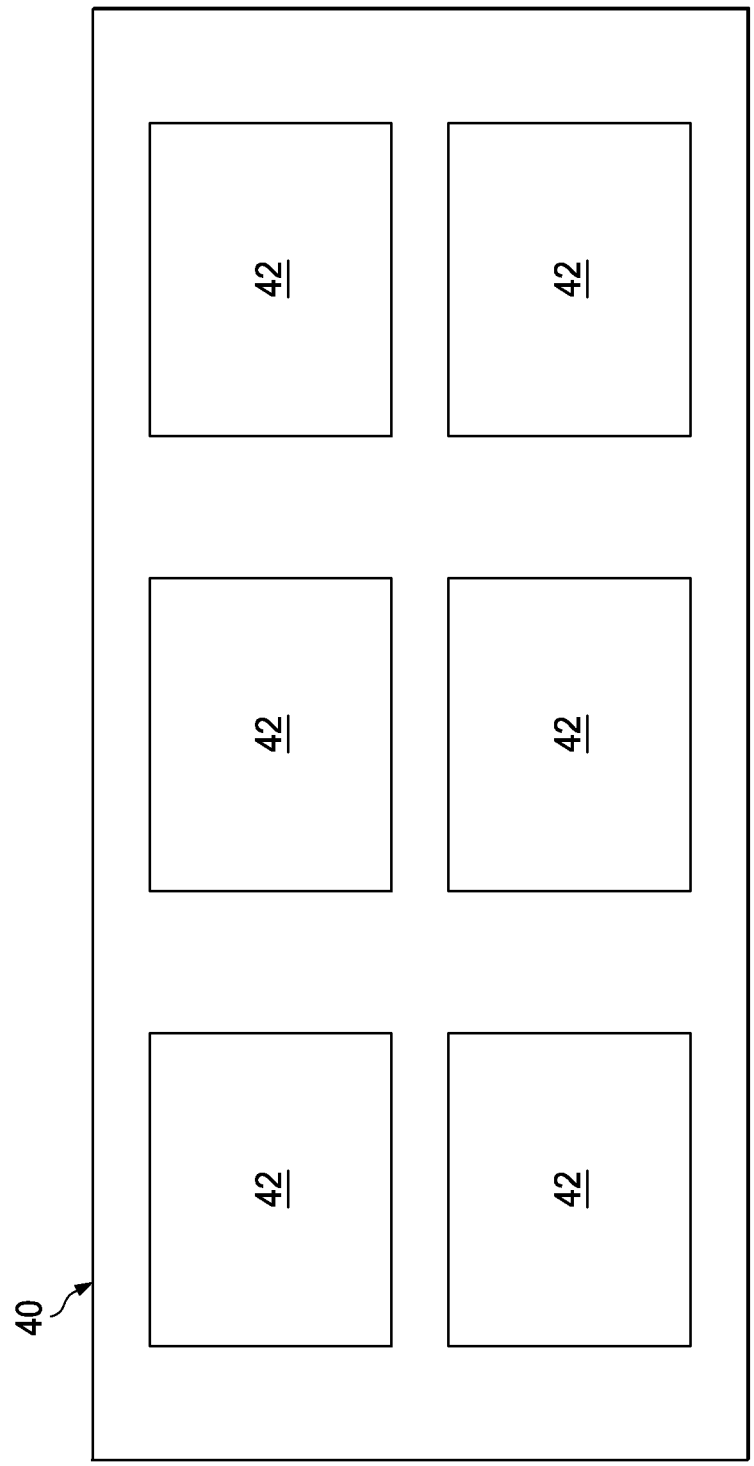

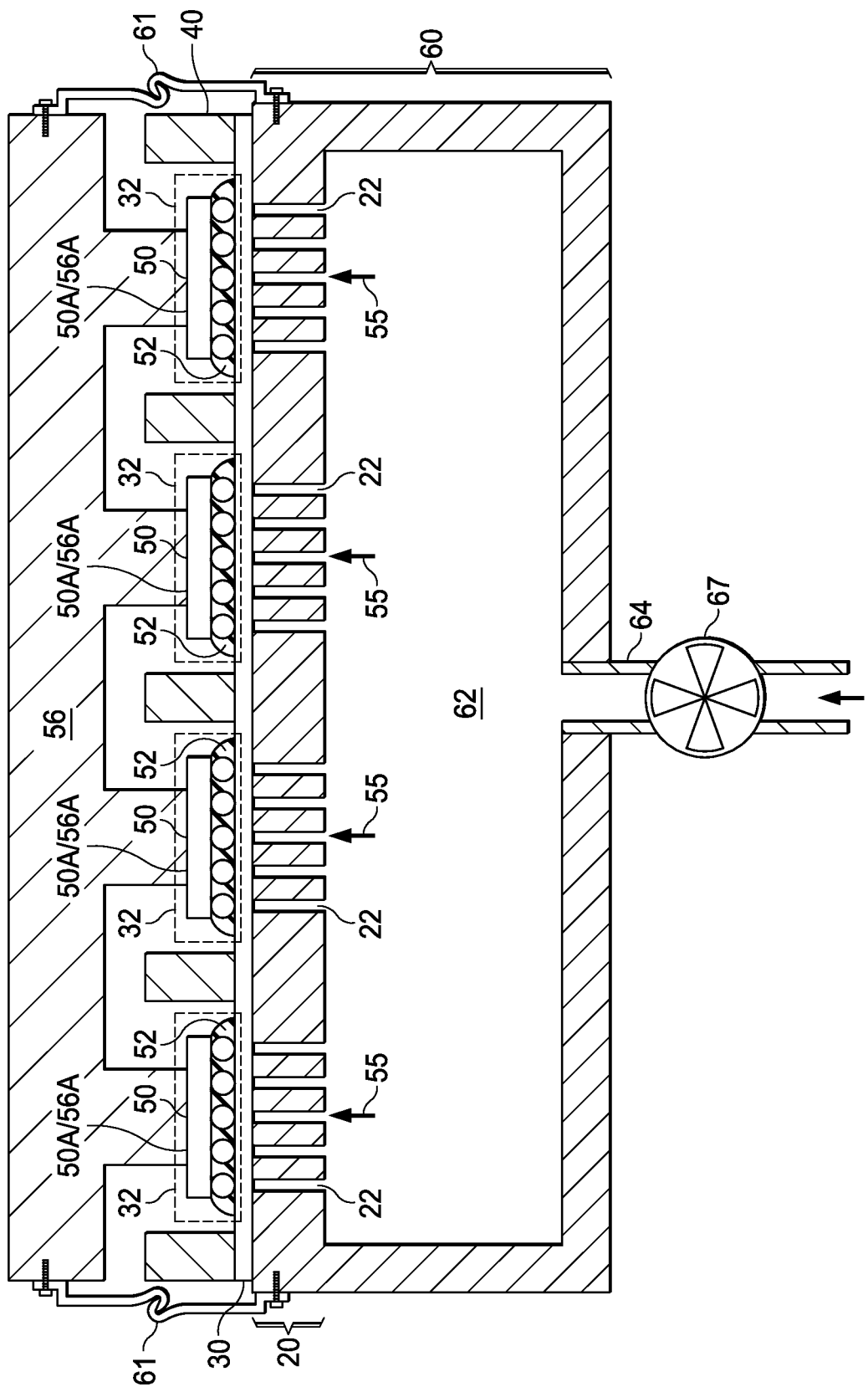

METHODS FOR FORMING 3DIC PACKAGE

This application is a divisional of U.S. patent application Ser. No. 13/272,032, entitled "Methods for Forming 3DIC Package," filed on Oct. 12, 2011, which application is incorporated herein by reference.

BACKGROUND

In the packaging of integrated circuits, dies may be packaged onto package substrates, which include metal connections that are used to route electrical signals between opposite sides of the package substrates. The dies may be bonded onto one side of a package substrate using flip chip bonding, and a reflow is performed to melt the solder balls that interconnect the dies and the laminate substrate.

The package substrates may use materials that can be easily laminated. In addition, organic materials may be used as the dielectric materials of the package substrate. These materials, however, are prone to the warpage caused by the elevated temperatures used in the reflow of the solder. Furthermore, during the bonding process, since the dies and the package substrates have significantly different coefficients of thermal expansion (CTEs), the warpage in the dies and the package substrates is worsened. For example, the silicon in the dies may have a CTE of 3.2, while the package substrates may have a CTE between about 17 and 20, or even higher. The warpage in the package substrates may cause irregular joints and/or bump cracks. As a result, the yield of the packaging process is adversely affected.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 6 are cross-sectional views and top views of intermediate stages in the manufacturing of a package in accordance with various embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Methods for forming packages are provided in accordance with embodiments. The variations of the embodiments are discussed. Throughout the various views and illustrative embodiments, like reference numbers are used to designate like elements. It is appreciated that the embodiments such as what are shown in FIGS. 1 through 7F are merely exemplary embodiments, and more embodiments may be developed based on the teaching of the exemplary embodiments.

Figure 1:
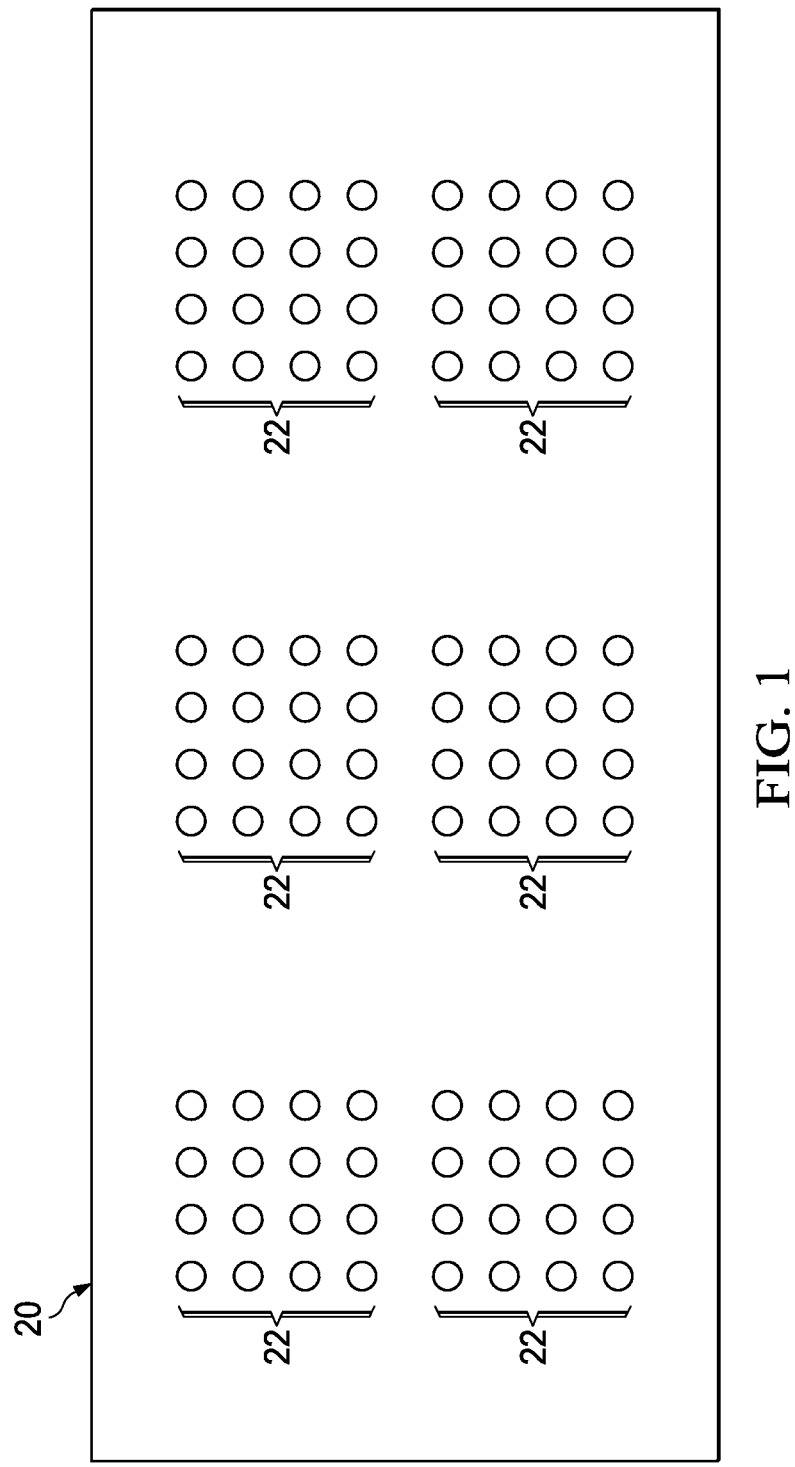

FIG. 1 illustrates a schematic top view of lower jig 20. In an exemplary embodiment, lower jig 20 may be formed of a dielectric material, a ferromagnetic material, or the like. Lower jig 20 may have a rectangular shape, although other shapes such as the rounded shape of a wafer may also be used. Lower jig 20 may comprise a plurality of through-openings 22 extending from the top side to the bottom side of lower jig 20 (please refer to FIGS. 4A through 5C). The top-view shape of openings 22 may be circles, rectangles, strips, or other shapes. Openings 22 may be distributed throughout lower jig 20.

FIG. 2A illustrates a top view of package component 30. Package component 30 may be a package substrate strip, and hence is referred to as package substrate strip 30 hereinafter, although package component 30 may be another type of package component such as an interposer. In accordance with embodiments, package substrate strip 30 includes a plurality of package substrates 32 that are identical to each other. In some embodiments, package substrates 32 are distributed uniformly throughout package substrate strip 30, and may have a pattern of an array. In other embodiments, package substrates 32 may be disposed as a plurality of groups, with the inter-group spacing between the groups greater than the inner-group spacing between package substrates 32 that are in the same group.

FIG. 2B schematically illustrates a cross-sectional view of one of package substrates 32, wherein the cross-sectional view is obtained from the plane crossing line 2B-2B in FIG. 2A. A plurality of connectors 36, which may be pre-solder regions, metal pads, or non-reflowable metal bumps, is formed on a side of package substrate 32. Metal features 36 are electrically coupled to metal features such as bond pads 38 on the opposite side of package substrate 32. Dashed lines 34 represent the electrical coupling between features 36 and 38, and may include a plurality of metal lines and vias interconnecting the metal lines.

FIG. 3 illustrates a top view of upper jig 40 in accordance with some embodiments. Throughout the description, lower jig 20 and upper jig 40 in combination are referred to as a jig set. Upper jig 40 may also be formed of a dielectric material, a metal, or the like. Upper jig 40 may have a rectangular shape, and may have substantially the same top-view size as lower jig 20 (FIG. 1). Upper jig 40 may include a plurality of openings 42. The size of each of openings 42 may be great enough to allow one package substrate 32 (FIG. 2), or a group of package substrates 32 to expose through when upper jig 40 is placed over lower jig 20.

Figure 4A:
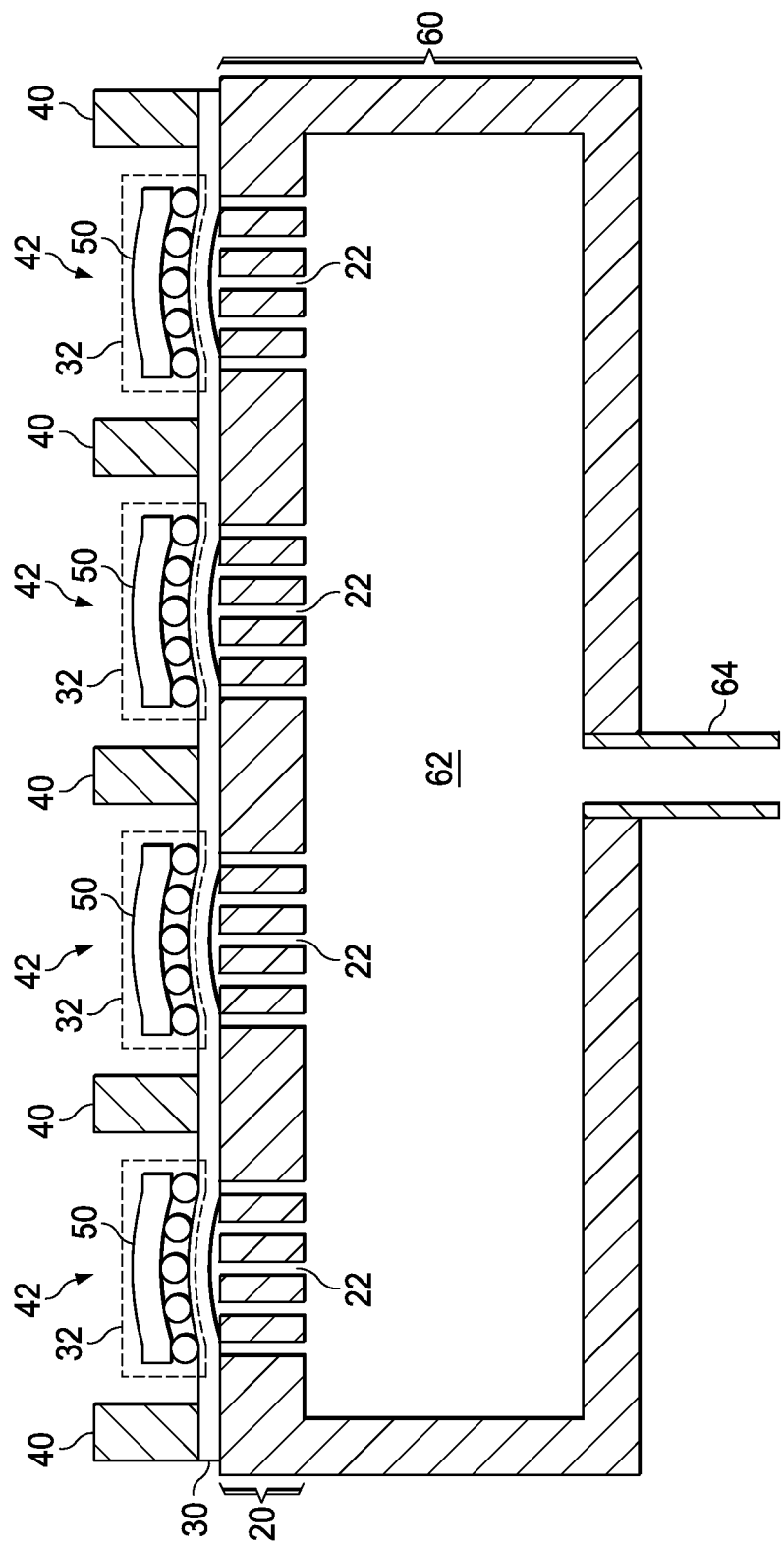

FIG. 4A illustrates a cross-sectional view showing the bonding of package components 50 onto package substrates 32. In some embodiments, package components 50 may be dies (such as device dies comprising CMOS devices), packages, or the like. For performing the bonding, package substrate strip 30 is first placed on lower jig 20. Upper jig 40 is placed on package substrate strip 30, with package substrates 32 exposed through openings 42 in upper jig 40. When lower jig 20, package substrate strip 30, and upper jig 40 are aligned, through-openings 22 of lower jig 20 may be, or may not be, aligned to openings 42 in upper jig 40. Upper jig 40 may be clamped onto lower jig 20. Alternatively, upper jig 40 and lower jig 20 may be attracted to each other through a magnetic force. Accordingly, package substrates 32 are fixed in position by upper jig 40 and lower jig 20. Package components 50 are then placed on package substrates 32, with the electrical features in one of package components 50 placed on, and electrically coupled to, the electrical features in a corresponding one of package substrates 32.

Figure 4B:
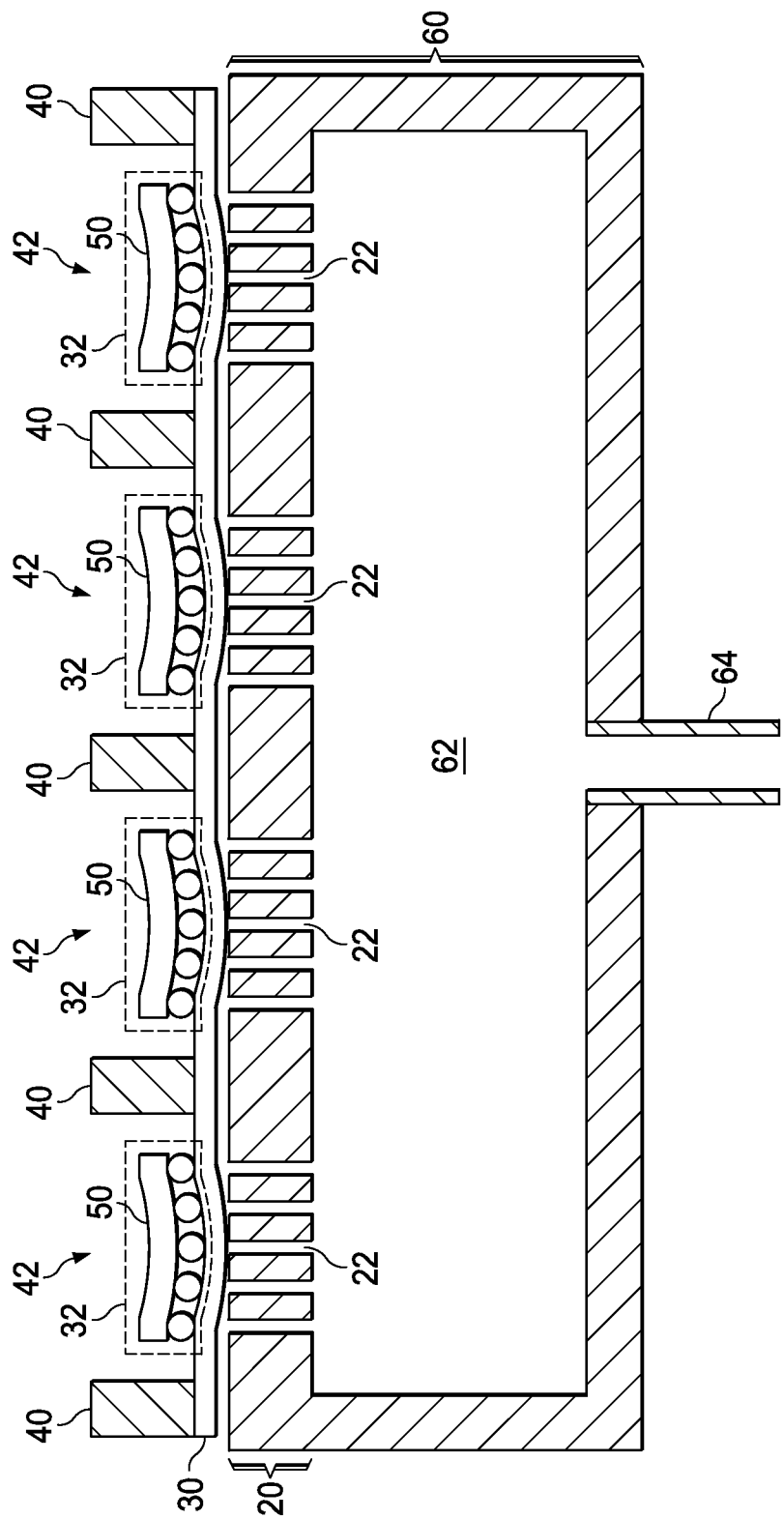

The bonding may be performed through solder bonding, wherein a reflow process is performed. Due to the heating and the temperature lowering steps in the reflow, after the reflow is finished, a warpage may be generated in package substrates 32, and possibly in package components 50. FIG. 4 illustrate the positive warpage generated in package substrates 32 and package components 50. Throughout the description, a positive warpage of a package component indicates that the central portion of the package component is higher than the edge portions of the package component. Conversely, a warpage can be a negative warpage (not shown in FIG. 4A, please refer to FIG. 4B), wherein the central portion of the package component is lower than the edge portions.

Figure 5A:
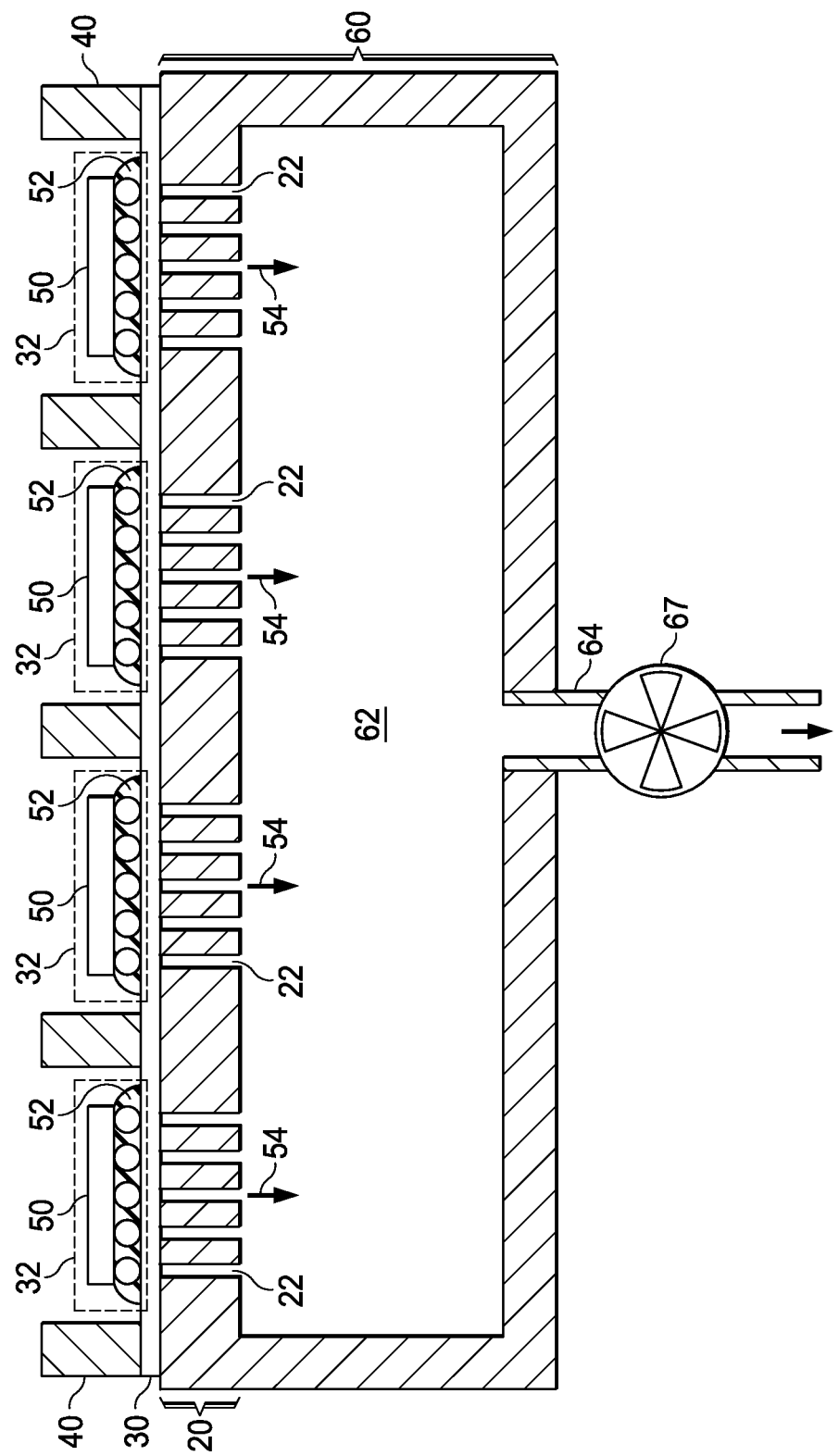

After the bonding process as in FIG. 5A, underfill 52 is dispensed into the spacing between package components 50 and package substrates 32, as shown in FIG. 5A, and the curing of the underfill 52 is performed to solidify underfill 52. In an exemplary embodiment, the curing is performed through a thermal process. Arrows 54 represents that vacuuming is performed through openings 22 in lower jig 20 during the curing of underfill 52. The vacuuming may be started before the curing of underfill 52 is started, and may be started before, during, or after the dispensing of underfill 52. At the time the vacuuming is started, underfill 52 is still a liquid. The vacuuming may be ended after the curing step is finished. Furthermore, the vacuuming may be ended wherein the dispensed underfill 52 is at least substantially solidified, or fully solidified. For example, if the curing is performed through a thermal process, the vacuuming may be started before the heating action is started, and stopped when the temperatures of package components 50, package substrate 32, and/or underfill 52 are lowered to substantially equal to the room temperature. The pressure in air-pressure boat 60 when the vacuuming is performed may be between about 0.001 Torr and about 100 Torr, although higher pressures that are lower than one atmosphere may be used. FIGS. 4A and 5A also illustrate an exemplary embodiment wherein lower jig is integrated as a top surface part of air-pressure boat 60, which includes inner space 62. Openings 22 in lower jig 20 and pipe (outlet) 64 are connected to the same inner space 62. Accordingly, by pumping air out of inner space 62, inner space 62 and openings 22 are vacuumed. The vacuuming may be performed through pump 66, which is connected to pipe 64.

Figure 6:
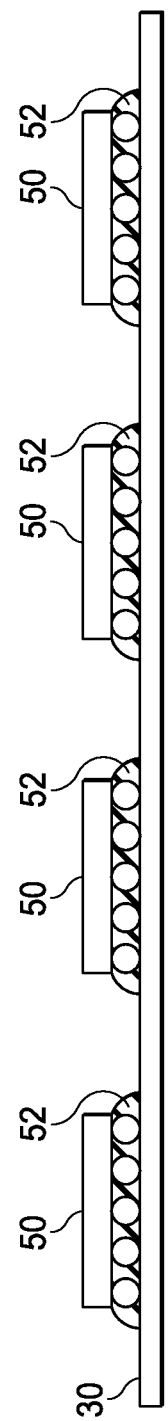

During the vacuuming, a downward force is applied to package substrates 32 due to the air-pressure, and hence package substrates 32 are flattened. Since underfill 52 is cured with package substrates 32 being flattened, after the curing, package substrates 32 are substantially flat, or at least flatter than before the curing process. As a result, package components 50 may also be flattened. The warpage in package substrates 32 and package components 50 is thus reduced. FIG. 6 schematically illustrates the resulting package that includes package substrates 32 and package components 50 after the curing is finished.

Figure 5B:
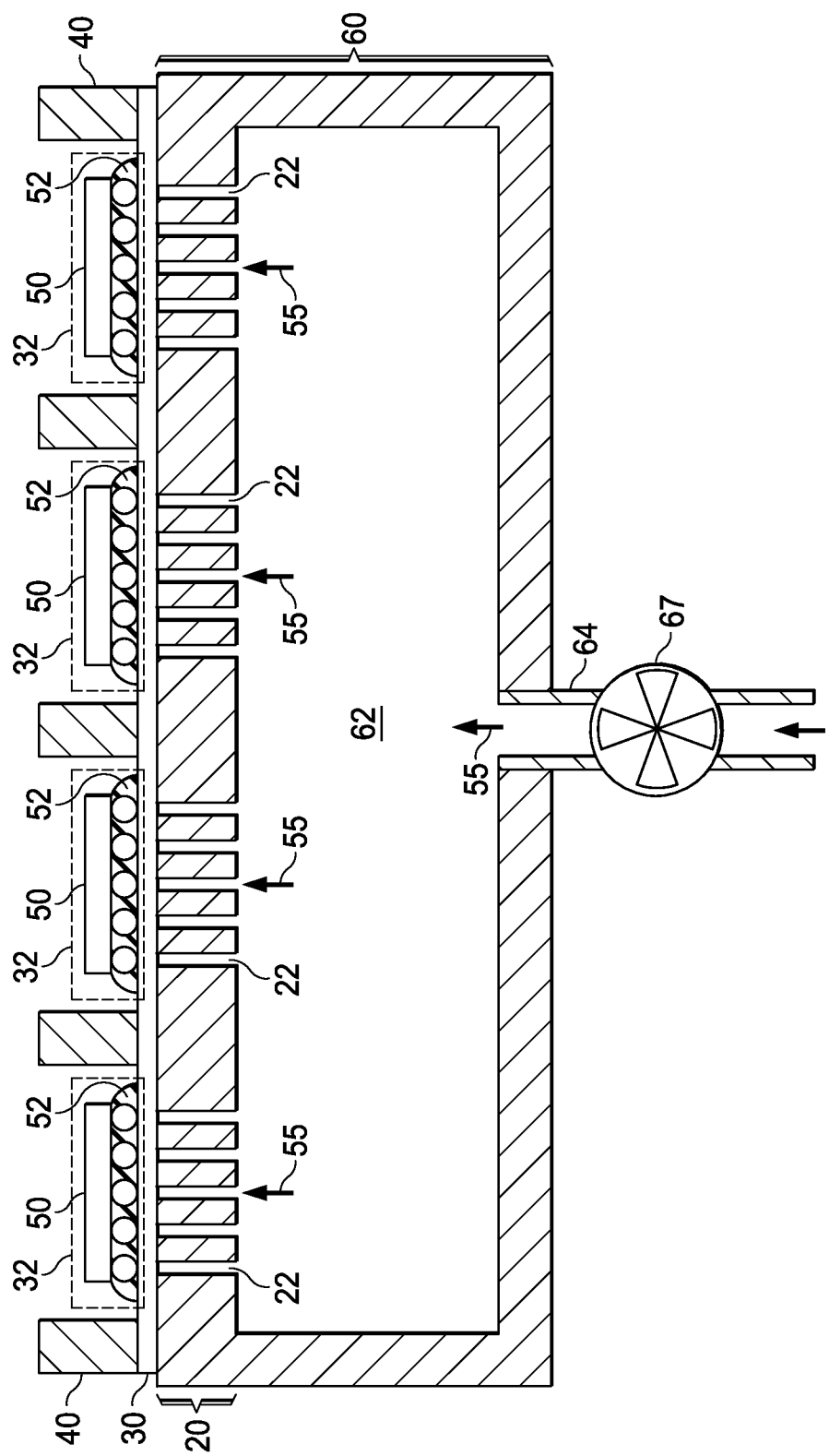

FIGS. 4A and 5A in combination illustrate that if the positive warpage occurs, the vacuuming is used in the underfill-curing process to reduce the warpage. FIGS. 4B and 5B in combination illustrate that if a negative warpage occurs, an air blowing is performed in the underfill-curing process to reduce the warpage. Referring to FIG. 4B, package components 50 are bonded to package substrate strip 30. The bonding process is essentially the same as shown in FIG. 4A, except that the negative warpage is generated in package substrates 32 and package components 50, and the center portion of package substrates 32 may be lower than the edge portions.

FIGS. 5B and 5C illustrate the dispensing of underfill 52 into the spacing between package components 50 and package substrates 32, and the curing of underfill 52 through a thermal process, for example. Underfill 52 may comprise epoxy resins, fillers, curing agents, adhesion promoters, and/or the like. An air blowing is performed through openings 22 in lower jig 20, wherein arrows 55 represent the blowing direction of the air during the curing of underfill 52. The air blowing may be started before the curing of underfill 52 is started, and may be started before, during, or after the dispensing of underfill 52. The air blowing may be ended after the curing step is finished. Furthermore, the air blowing may be ended wherein the dispensed underfill 52 is at least substantially solidified, or fully solidified. For example, if the curing process is performed through a thermal process, the air blowing may be started before the respective heating process, and finished when the temperature is lowered to substantially equal to the room temperature. The pressure applied by the air blowing to package substrates 32 may be between about 1 atmosphere and about 10 atmospheres. It is realized that these values are merely examples, and may change depending on the material and the structure of package substrates 32 and package components 50.

As shown in FIG. 5B, the air blowing may be performed by blowing air into pipe 64. As a result, the air, as represented by arrows 55, may be blown to openings 22 and in turn to package substrates 32. The air blowing may be performed through air blower 67, which is connected to pipe 64. Air blower 67 in FIG. 5B and pump 66 in FIG. 5A may be the same device that is capable to drive air in opposite directions, and hence may operate as a pump when configured to drive air out of inner space 62, and operate as an air blower when configured to drive air into inner space 62. Due to the air blowing, an upward force is applied to package substrates 32, and hence package substrates 32 are flattened. Since underfill 52 is cured with package substrates 32 being flattened, after the curing, package substrates 32 and package components 50 are substantially flat, or at least flatter than before the curing process. The warpage is thus reduced.

FIG. 5C illustrates an underfill dispensing and curing process similar to what is shown in FIG. 5B, except that blocker 56 is added to prevent the over-correction of warpage. Blocker 56 comprises bottom surface 56A in contact with top surfaces 50A of package components 50, and hence blocker 56 may prevent package substrates 32 from being blown upwardly. For example, assuming that the blowing force applied by air blower 67 on package substrates 32 is greater than necessary, if blocker 56 does not exist, package substrates 32 may have a positive warpage after the curing of underfill 52. With blocker 56 being in the way of package substrates 32, the upward movement of package substrates 32 is stopped by blocker 56. As a result, even if the blowing force applied by air blower 67 on package substrates 32 is greater than necessary, package substrates 32 is still substantially flat. Blocker 56 may be formed of metals, dielectric materials such as ceramics, organic materials, or the like. Blocker 56 may be clamped or screwed on air-pressure boat 60, for example using the schematically illustrated clamps 61. Alternatively, blocker 56 is not clamped or screwed, and stops the upward movement of package substrates 32 through the weight of blocker 56. In some exemplary embodiments, the weight of blocker 56 applied to each of package components 32 may be between about 5 grams and about 5000 grams.

In an exemplary embodiment, the curing is a thermal curing with a temperature between about 50° C. and about 200° C. The duration of the thermal curing may be between about 10 minutes and about 200 minutes. In alternative embodiments, the curing is a ultra-violet (UV) curing, wherein the duration of the UV curing may be between about 10 minutes and about 200 minutes. In yet alternative embodiments, the curing is an Infrared Radiation (IR) curing, wherein the duration of the IR curing may be between about 10 minutes and about 200 minutes. In yet alternative embodiments, the curing is a microwave curing, wherein the duration of the microwave curing may be between about 10 minutes and about 200 minutes. FIG. 6 schematically illustrates the package after the curing step (as shown in FIGS. 5B or 5C) is finished.

Figure 7A:
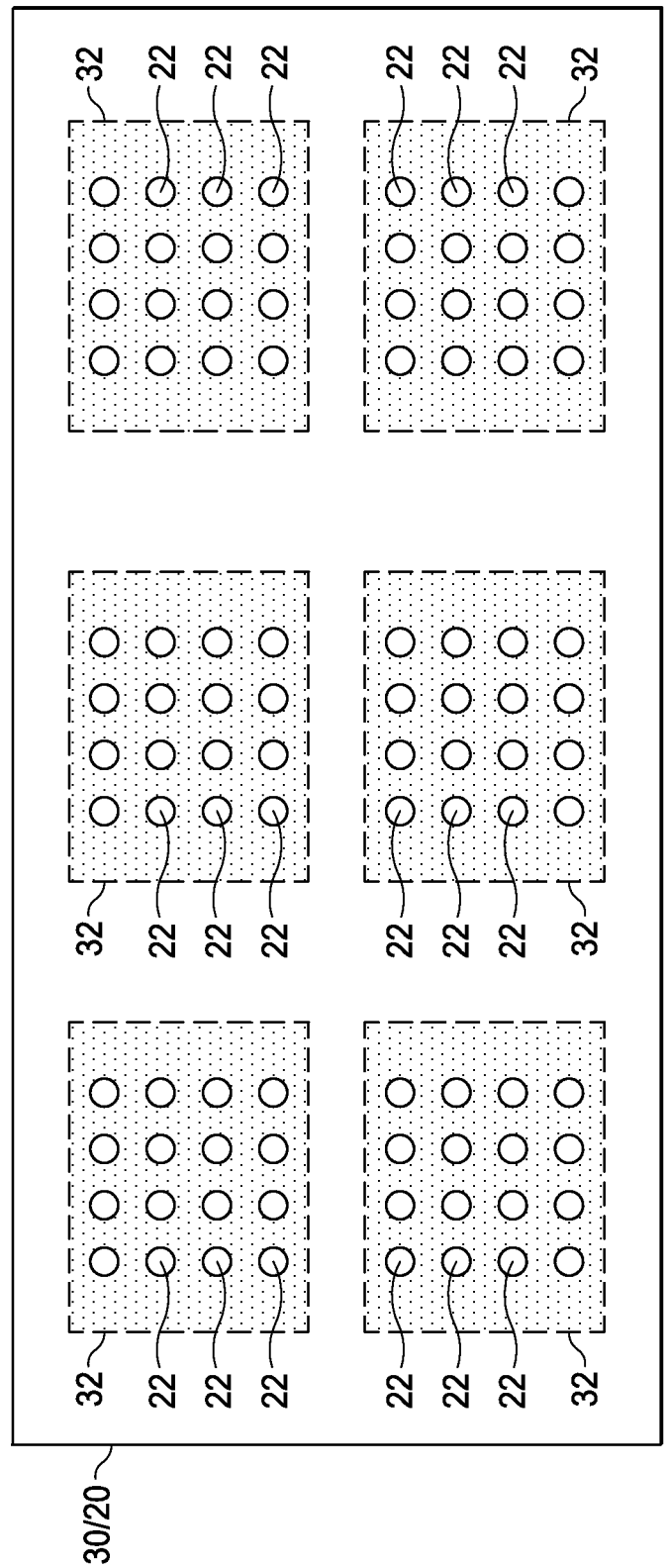
FIGS. 7A through 7F are exemplary configurations of the openings in the bottom jig.
Figure 7B:
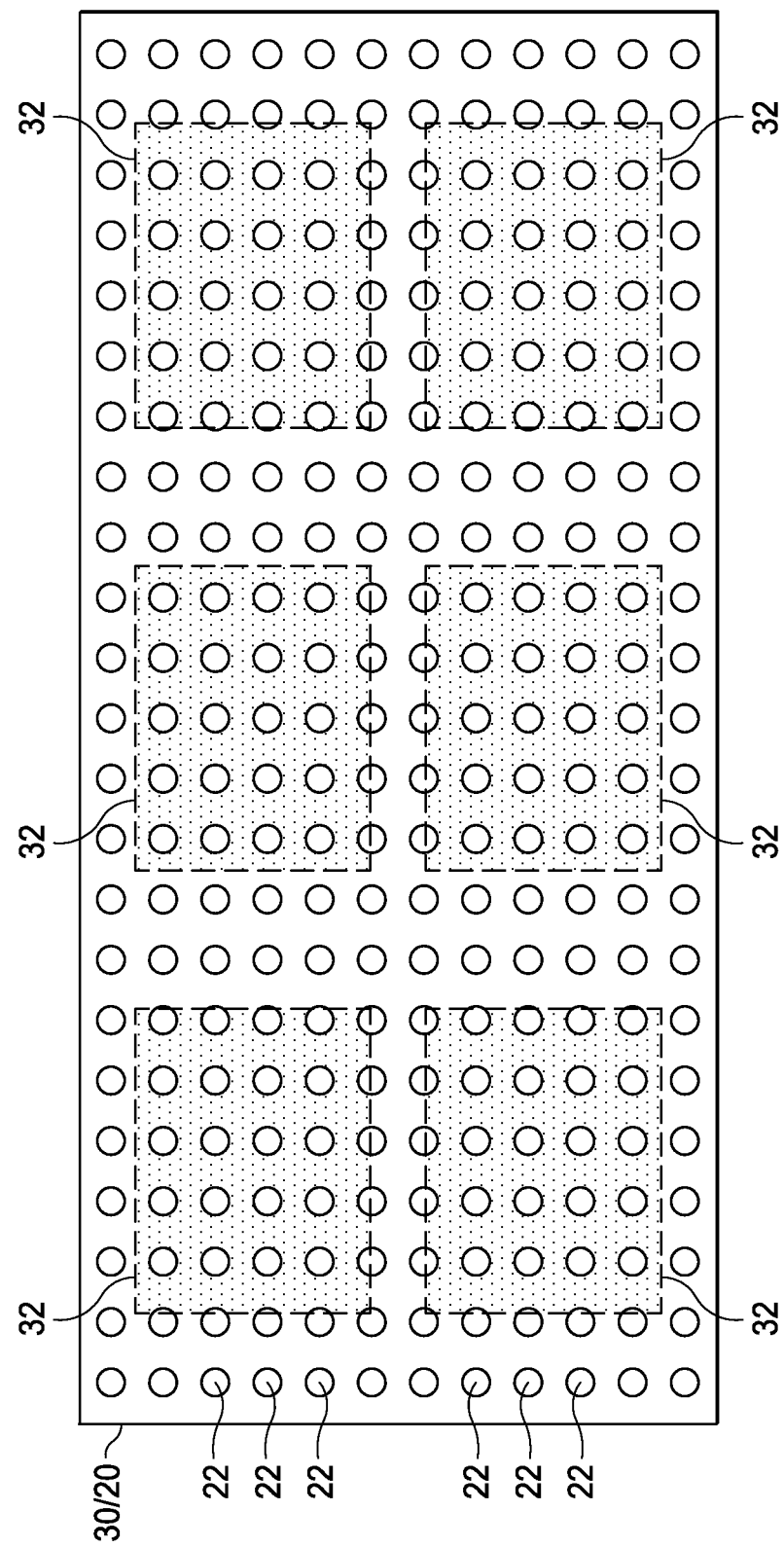
Figure 7C:
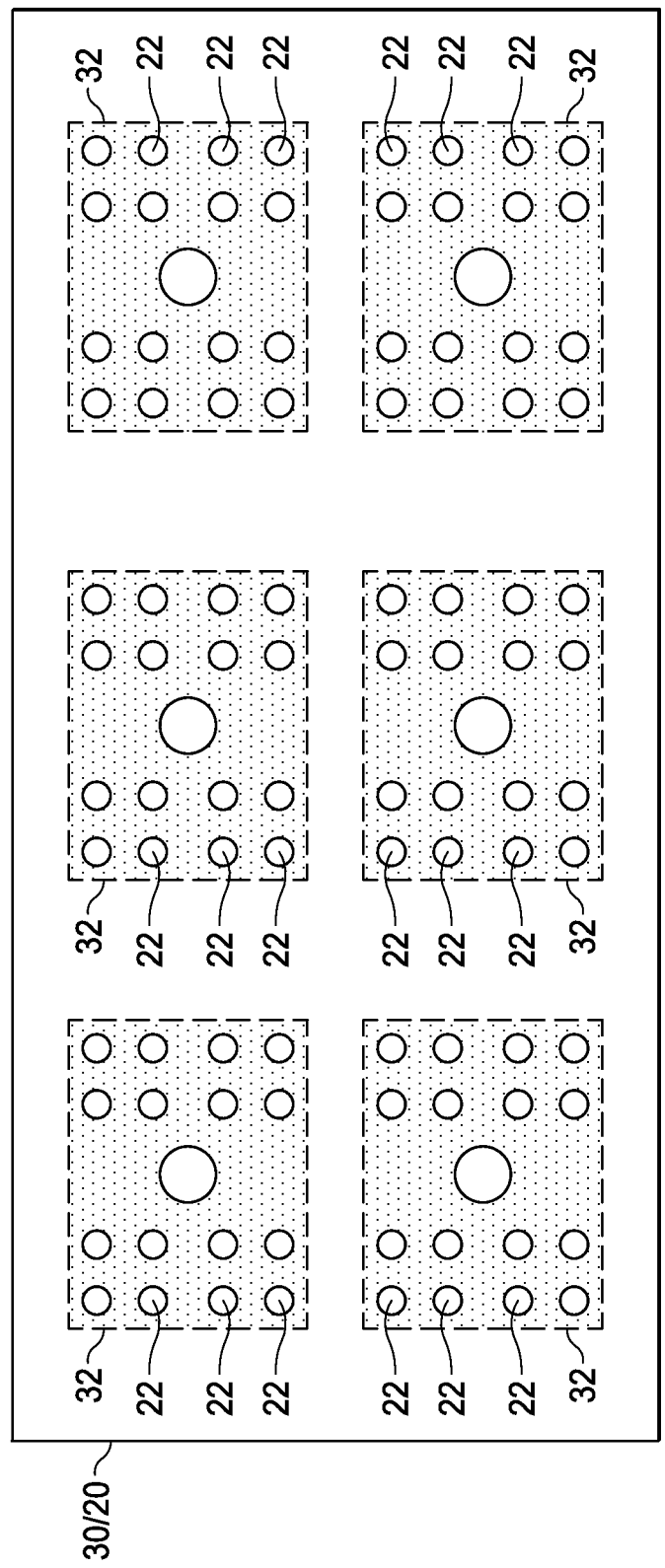
Figure 7D:
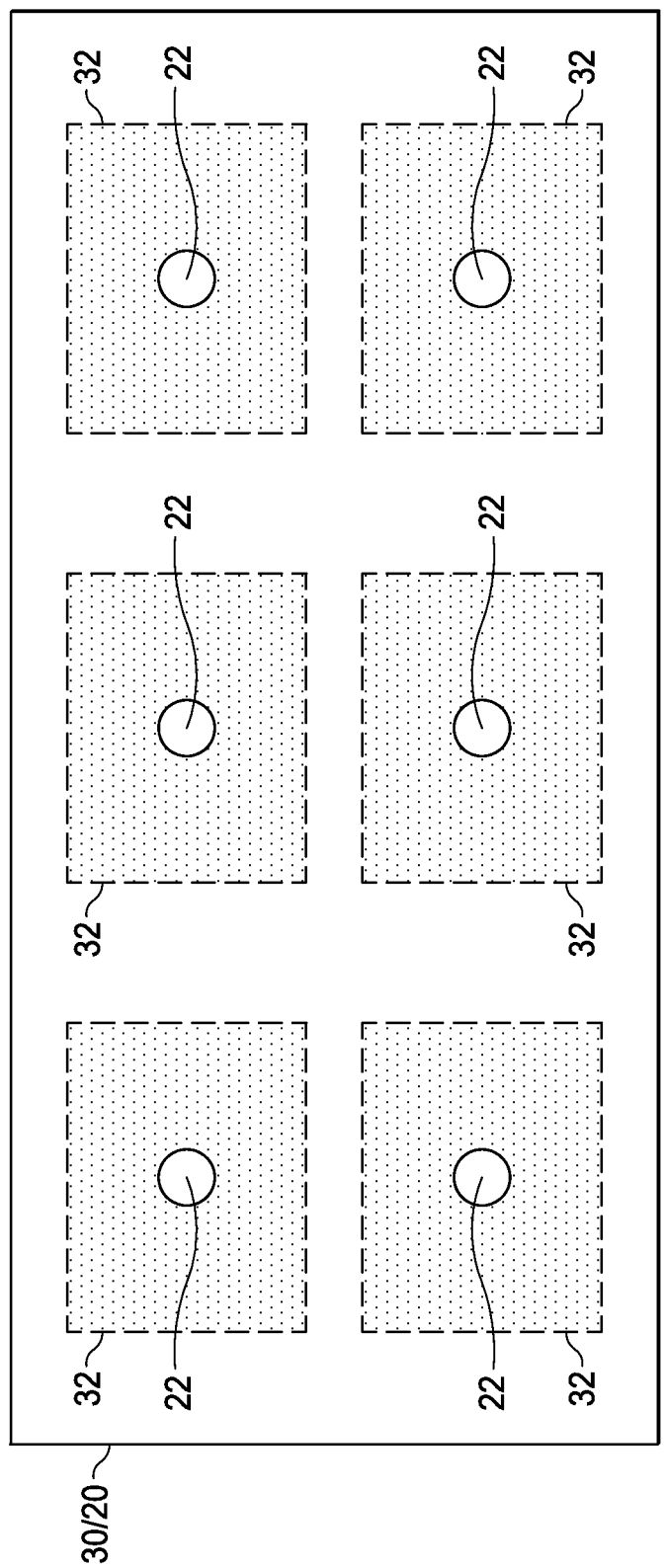
Figure 7E:
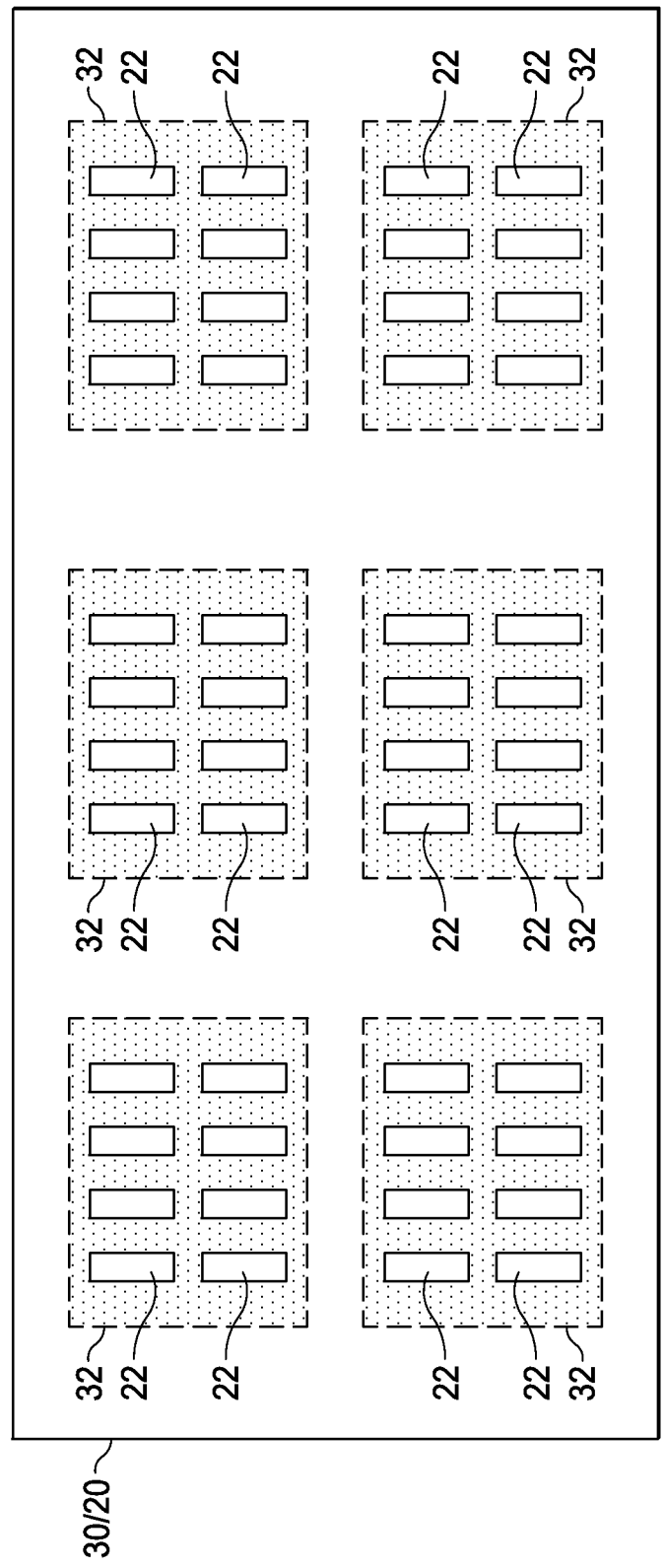
Figure 7F:
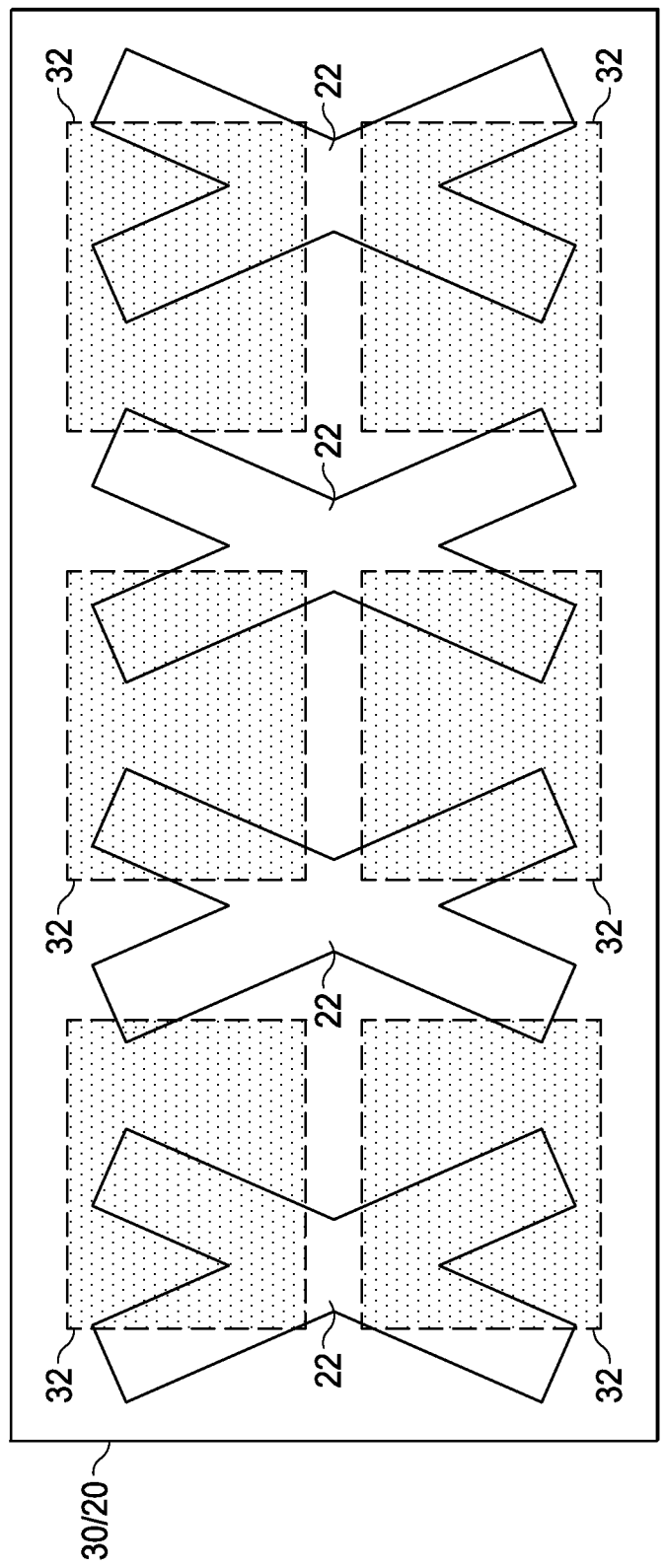

FIGS. 7A through 7F illustrate some example configurations of openings 22, wherein the top views of openings 22 may be obtained from the structure shown in FIGS. 5A and 5B. Package substrates 32 are also illustrated to show the relative positions of openings 22 and package substrates 32. The top view shapes of openings 22 may be circles, rectangles (such as squares, strips, hexagons, octagons, or the like. In FIG. 7A, openings 22 are uniformly distributed within the boundary of the respective package substrates 32, and may have a substantially uniform size. In FIG. 7B, openings 22 are uniformly distributed throughout lower jig 20. In FIG. 7C, the central opening 22 that corresponding to the center of each of package substrates 32 may have a size larger than remaining ones of openings 22 that are aligned to the same package substrate 32. In FIG. 7D, there is one opening 22 under, and possibly aligned to the center, of each of package substrates 32. In FIG. 7E, openings 22 have strip shapes. In FIG. 7F, strip openings are distributed throughout lower jig 20, wherein the strip openings may have various top-view shapes including crosses, for example. It is realized that these configurations are merely examples, and there are various alternative applicable configurations, as long as the needed air pressures may be applied through openings 22 during the curing of underfill 52 (FIGS. 4A through 5C).

Conventionally, to reduce the warpage of package substrates, jigs may be used to press the package substrates from opposite sides. The jigs may include a lower jig and an upper jig. The upper jig typically has a grid pattern with openings therein, and a package substrate is sandwiched between the lower jig and the upper jig. Portions of the package substrate are exposed through the openings in the upper jig. Dies are bonded to the package substrate through the openings. Although the use of jigs may alleviate the warpage, warpage still exists. In the embodiments, during the curing of the underfill in the packaging process, a correction force is applied to the package components that are being packaged, either through vacuuming or air blowing. The warpage generated in the packaging process may thus be corrected.

In accordance with embodiments, a method includes dispensing an underfill between a first package component and a second package component, wherein the first package component is placed on a lower jig, and the second package component is over and bonded to the first package component. A through-opening is in the lower jig and under the first package component. The underfill is cured, wherein during the step of curing the underfill, a force is applied to flatten the first package component. The force is applied by performing an action selected from the group consisting essentially of vacuuming and air blowing through the through-opening.

In accordance with other embodiments, a method includes placing a first package component over a lower jig, wherein the first package component covers an opening extending from a top surface to a bottom surface of the lower jig. An upper jig is placed over the first package component, wherein the upper jig secures the first package component on the lower jig. A second package component is bonded onto the first package component. An underfill is dispensed between the first package component and the second package component. The underfill is cured, wherein at a time between a starting time and an ending time of the step of curing the underfill, an action selected from the group consisting essentially of vacuuming and air blowing is performed, and wherein the action is performed through the through-opening.

In accordance with yet other embodiments, an air-pressure boat includes a lower jig at a top surface of the air-pressure boat. The lower jig comprises a through-opening extending from a top surface to a bottom surface of the lower jig. The device further includes an upper jig comprising an opening, wherein the upper jig is configured has a top-view size substantially equal to a top-view size of the lower jig.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
    an upper jig, wherein the upper jig forms a grid comprising a first plurality of through-openings, with the first plurality of through-openings forming grid openings of the grid, each of the first plurality of openings configured to surround a package on a package substrate strip; and
    a lower jig comprising:
        a second plurality of through-openings, wherein with the lower jig aligned to the upper jig, the second plurality of through-openings is configured to be exposed through the first plurality of through-openings; and
        a planar top surface, wherein the second plurality of through-openings is configured to be fully covered by the package substrate strip.

2. The apparatus of claim 1, wherein the second plurality of through-openings is grouped as a plurality of groups have patterns same as each other, and wherein inner-group spacings between through-openings in a same one of the plurality of groups are smaller than inter-group spacings between different ones of the plurality of groups.

3. The apparatus of claim 1, wherein the second plurality of through-openings is distributed substantially uniformly.

4. The apparatus of claim 1 further comprising an air pressure boat comprising:
    an inner space, with the lower jig being a top part of the air pressure boat, wherein the air pressure boat is configured to maintain the inner space a pressure different from a pressure outside of the air pressure boat with the second plurality of through-openings being sealed; and
    an outlet connecting the inner space of the air pressure boat to an external environment that I external to the air pressure boat.

5. The apparatus of claim 4 further comprising a pump connected to the outlet of the air pressure boat.

6. The apparatus of claim 4 further comprising an air blower connected to the outlet of the air pressure boat, wherein the air blower is configured to blow air into the inner space.

7. The apparatus of claim 1, wherein the upper jig and the lower jig have substantially a same top-view shape and substantially a same top-view size.

8. The apparatus of claim 1 being configured to hold the package substrate strip between the upper jig and the lower jig, with package substrates in the package substrate strip exposed through the first plurality of through-openings, wherein the second plurality of openings is configured to be fully sealed by the package substrate strip.

9. An apparatus configured to flatten a package substrate strip comprising a plurality of package substrates, the apparatus comprising:
    an air pressure boat comprising a top part having a planar top surface, with the top part comprising a plurality of through-openings, wherein the package substrate strip is configured to fully cover the plurality of through-openings; and
    an upper jig comprising:
        a planar bottom surface;
        a first plurality of strips extending in a first direction; and
        a second plurality of strips extending in a second direction perpendicular to the first direction, wherein the first plurality of strips and the second plurality of strips form a grid, and wherein the first plurality of strips and the second plurality of strips are configured to cover portions of the package substrate strip, with the covered portions of the package substrate strip connecting neighboring ones of the plurality of package substrates.

10. The apparatus of claim 9, wherein the air pressure boat further comprises:
    an inner space connected to the plurality of through-openings; and
    an outlet connected to the inner space.

11. The apparatus of claim 10 further comprising a pump connected to the outlet of the air pressure boat, wherein the pump is configured to vacuum the inner space.

12. The apparatus of claim 10 further comprising an air blower connected to the outlet of the air pressure boat, wherein the air blower is configured to blow air into the inner space.

13. The apparatus of claim 9, wherein the upper jig comprises a plurality of grid openings defined by the first plurality of strips and the second plurality of strips, and wherein each of the grid openings is configured to be aligned to one of the package substrates.

14. The apparatus of claim 9, wherein the upper jig and the top part substantially a same top-view shape and substantially a same top-view size.

15. The apparatus of claim 9, wherein all through-openings of the top part are aligned to the plurality of through-openings of the upper jig.

16. The apparatus of claim 9, wherein the plurality of through-openings of the top part comprises:
    portions overlapped by the first plurality of strips and the second plurality of strips of the upper jig with the upper jig and the top part being aligned; and
    additional portions misaligned with the first plurality of strips and the second plurality of strips of the upper jig with the upper jig and the top part being aligned.

17. An apparatus comprising:
    an upper jig, wherein the upper jig forms a grid including a first plurality of through-openings forming grid openings of the grid, each of the first plurality of openings configured to surround a package on a package substrate strip; and
    an air pressure boat comprising:
        an inner space;
        a lower jig having a planar top surface, substantially a same top-view shape and substantially a same top-view size as the upper jig; and
        a second plurality of through-openings in the lower jig, wherein the second plurality of through-openings connects the inner space to an external environment that is external to the air pressure boat, wherein the second plurality of through-openings is configured to be fully covered the package substrate strip.

18. The apparatus of claim 17, wherein with the lower jig aligned to the upper jig, the second plurality of through-openings is exposed through the first plurality of through-openings.

19. The apparatus of claim 17 further comprising a pump connected to the air pressure boat, wherein the pump is configured to vacuum the inner space.

20. The apparatus of claim 17 further comprising an air blower connected to the air pressure boat, wherein the air blower is configured to blow air into the inner space.

* * * * *